(12) United States Patent
Kim et al.

(10) Patent No.: US 11,133,483 B2
(45) Date of Patent: Sep. 28, 2021

(54) ORGANIC LIGHT EMITTING DISPLAY PANEL HAVING BASE DAM COVERING ONE SIDE OF POWER ELECTRODE

(71) Applicant: Samsung Display Co., Ltd., Yongin-si (KR)

(72) Inventors: Heena Kim, Hwaseong-si (KR); Sangjin Park, Yongin-si (KR); Youngseok Baek, Hwaseong-si (KR); Taehyeok Choi, Seoul (KR); Mijung Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 176 days.

(21) Appl. No.: 16/590,075

(22) Filed: Oct. 1, 2019

(65) Prior Publication Data
US 2020/0111987 A1    Apr. 9, 2020

(30) Foreign Application Priority Data

Oct. 4, 2018 (KR) .................. 10-2018-0118458

(51) Int. Cl.
*H01L 51/52* (2006.01)
*H01L 27/32* (2006.01)

(52) U.S. Cl.
CPC ........ *H01L 51/5206* (2013.01); *H01L 27/323* (2013.01); *H01L 51/5246* (2013.01); *H01L 51/5253* (2013.01)

(58) Field of Classification Search
CPC ............ H01L 27/3225; H01L 27/3246; H01L 27/3248; H01L 27/3297; H01L 51/5246; H01L 51/525; H01L 51/5253; H01L 51/5256
See application file for complete search history.

(56) References Cited

U.S. PATENT DOCUMENTS

| | | | |
|---|---|---|---|
| 9,859,334 B2 | 1/2018 | Kim et al. | |
| 10,629,845 B2 | 4/2020 | Kim et al. | |
| 2018/0059862 A1 | 3/2018 | Zeng et al. | |
| 2018/0138450 A1 | 5/2018 | Park et al. | |
| 2019/0165312 A1* | 5/2019 | Bae | H01L 27/3276 |
| 2019/0198587 A1 | 6/2019 | Park et al. | |

FOREIGN PATENT DOCUMENTS

| | | |
|---|---|---|
| KR | 10-2016-0000853 A | 1/2016 |
| KR | 10-1740628 B1 | 5/2017 |
| KR | 10-2017-0134903 A | 12/2017 |
| KR | 10-2018-0054385 A | 5/2018 |
| KR | 10-2019-0076093 A | 7/2019 |
| KR | 10-2019-0109690 A | 9/2019 |

* cited by examiner

*Primary Examiner* — Hoai V Pham
(74) *Attorney, Agent, or Firm* — Lewis Roca Rothgerber Christie LLP

(57) ABSTRACT

An organic light emitting display panel includes an organic light emitting element, an encapsulation layer sealing the organic light emitting element, a power electrode providing a power voltage to the organic light emitting element, and a partial wall preventing an organic material from flowing while the encapsulation layer is formed. The partition wall includes a base dam covering one side of the power electrode, a first dam covering one side of the base dam, a second dam covering the other side of the base dam, a third dam covering one side of the first dam, and a fourth dam covering one side of the second dam.

20 Claims, 12 Drawing Sheets

ORGANIC LIGHT EMITTING DISPLAY PANEL HAVING BASE DAM COVERING ONE SIDE OF POWER ELECTRODE

CROSS-REFERENCE TO RELATED APPLICATION

This application claims priority to and the benefit of Korean Patent Application No. 10-2018-0118458, filed on Oct. 4, 2018, the entire content of which is hereby incorporated by reference.

BACKGROUND

Aspects of some example embodiments of the present disclosure relate to an organic light emitting display panel and an organic light emitting display device including the same.

A display device may be divided into a display area, at which images are displayed, and a non-display area where images are not displayed. In an effort to increase the display area on which images are displayed, there is an interest in reducing the width of the non-display area. However, as the non-display area is reduced, the surface area of each of the elements integrated in the non-display area may become smaller.

Also, an organic light emitting display device of the display device may include an organic light emitting element (OLED). To protect an organic material that is vulnerable to oxygen and moisture, various techniques for sealing the organic light emitting elements (OLED) may be utilized. A thin film encapsulation technique may include an encapsulation layer located on the organic light emitting elements (OLED) elements to block a penetration path of air and moisture. An encapsulation layer may have a structure in which an inorganic layer including an inorganic material and an organic layer including an organic material are alternately laminated. However, when the organic material flows to an unnecessary area while the organic material layer is formed, the exposed organic layer may be provided to the permeation path of the air and moisture.

The above information disclosed in this Background section is only for enhancement of understanding of the background of the invention and therefore the information in the present Background does not necessarily constitute prior art.

SUMMARY

Aspects of some example embodiments of the present disclosure include a display device in which an encapsulation layer protecting an organic light emitting element is improved in reliability.

Some example embodiments of the inventive concept include an organic light emitting display panel including a base member, an organic light emitting element, a power electrode, a first base dam, a connection electrode, a first dam, a second dam, a third dam, and a fourth dam.

The base member may include a first area and a second area surrounding the first area. The organic light emitting element may be on the first area and include an anode, a cathode, and a light emitting layer between the anode and the cathode. The power electrode may be electrically connected to the anode and on the second area.

The first base dam may be on the second area to cover one side of the power electrode. The connection electrode may be configured to cover one side of the power electrode and a first side of the first base dam and include the same material as the anode. The first dam may be configured to cover the first side of the first base dam and one side of the connection electrode. The second dam may be configured to cover a second side of the first base dam and spaced apart from the first dam. The third dam may be configured to cover one side of the first dam and a portion of the connection electrode. The fourth dam may be configured to cover one side of the second dam and spaced apart from the third dam.

According to some example embodiments, the first dam may include the same material as the second dam.

According to some example embodiments, the third dam may include the same material as the fourth dam.

According to some example embodiments, the organic light emitting display panel may further include a transistor electrically connected to the organic light emitting element and an insulation layer. The insulation layer may be configured to cover the transistor, between the anode and the transistor, and include the same material as the first base dam.

According to some example embodiments, a through-hole may be defined in the insulation layer, and the anode may be connected to the transistor through the through-hole.

According to some example embodiments, the organic light emitting display panel may further include a pixel defining layer in which an opening exposing the anode is defined and which includes the same material as each of the first dam and the second dam.

According to some example embodiments, the organic light emitting display panel may further include a spacer on the pixel defining layer and including the same material as each of the third dam and the fourth dam.

According to some example embodiments, the organic light emitting display panel may further include an encapsulation layer configured to seal the organic light emitting element. The encapsulation layer may include: a first inorganic layer configured to cover the cathode, the first base dam, the first dam, the second dam, the third dam, and the fourth dam; an organic layer on the first inorganic layer to overlap the cathode; and a second inorganic layer configured to cover the organic layer and the first inorganic layer.

According to some example embodiments, the organic light emitting display panel may further include: a second base dam on the second area and spaced apart from the first base dam; a fifth dam configured to cover a first side of the second base dam; a sixth dam configured to cover a second side of the second base dam and spaced apart from the fifth dam; a seventh dam configured to cover one side of the fifth dam; and an eighth dam configured to cover one side of the sixth dam.

According to some example embodiments, the second base dam may include the same material as the first base dam, each of the fifth dam and the sixth dam may include the same material as each of the first dam and the second dam, and each of the seventh dam and the eighth dam may include the same material as each of the third dam and the fourth dam.

According to some example embodiments, a groove may be defined in a portion of the first base dam, which does not overlap the first dam and the second dam.

According to some example embodiments, the power electrode may transmit a power voltage to the organic light emitting element.

According to some example embodiments of the inventive concept, an organic light emitting display panel includes a base member, an organic light emitting element, a power electrode, and a partition wall.

The base member may include a first area and a second area surrounding the first area. The organic light emitting element may be on the first area and include an anode, a cathode, and a light emitting layer between the anode and the cathode. The power electrode may be electrically connected to the anode and on the second area.

The partition wall may include a base dam, a first dam, a second dam spaced apart from the first dam, a third dam, and a fourth dam spaced apart from the third dam.

Each of the base dam, the first dam, the second dam, the third dam, and the fourth dam may include a first side and a second side that is further away from the organic light emitting element than the first side.

The base dam may be on the second area to cover one side of the power electrode. The first dam may cover the first side of the base dam, the second dam may cover the second side of the base dam, the third dam may cover the first side of the first dam, and the fourth dam may cover the second side of the second dam.

BRIEF DESCRIPTION OF THE FIGURES

The accompanying drawings are included to provide a further understanding of the inventive concept, and are incorporated in and constitute a part of this specification. The drawings illustrate aspects of some example embodiments of the inventive concept and, together with the description, serve to explain principles of the inventive concept. In the drawings.

DETAILED DESCRIPTION

Hereinafter, aspects of some example embodiments of the inventive concept will be described with reference to the accompanying drawings.

In the figures, the ratio and dimensions of components are exaggerated for clarity of illustration. The term "and/or" includes any and all combinations of one or more of the associated listed items.

The meaning of 'include' or 'comprise' specifies a property, a fixed number, a step, an operation, an element, a component or a combination thereof, but does not exclude other properties, fixed numbers, steps, operations, elements, components or combinations thereof.

Figure 1:
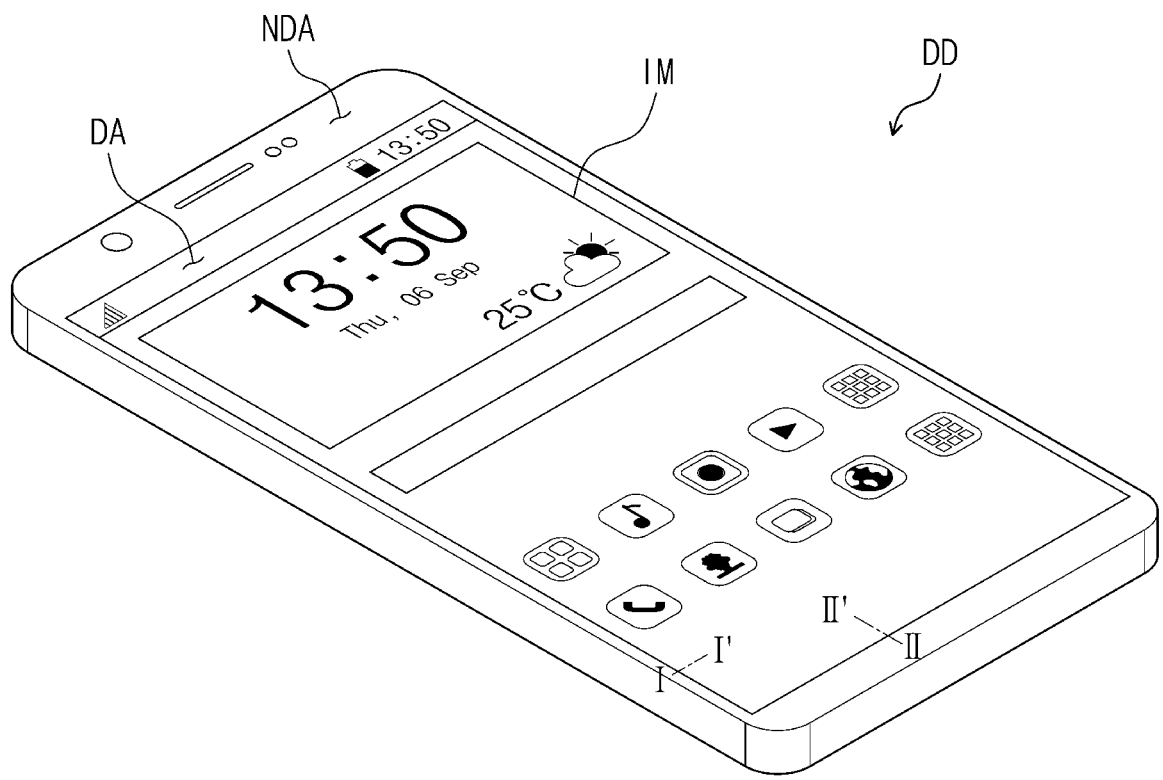
FIG. 1 is a perspective view of a display device according to some example embodiments of the inventive concept.
Figure 1:
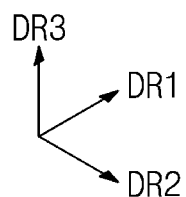

FIG. 1 is a perspective view of a display device DD according to some example embodiments of the inventive concept.

In FIG. 1, the display device DD is illustrated as a smart phone. However, the embodiments of the inventive concept are not limited thereto. For example, the display device DD according to some example embodiments of the inventive concept may be used for large-sized electronic devices such as televisions and monitors and small and middle-sized electronic devices such as mobile phones, tablet PC, navigation units for vehicles, game consoles, and smart watches.

A display area DA and a non-display area NDA may be defined on the display device DD.

The display area DA at which an image IM is displayed is parallel to a surface defined by a first directional axis DR1 and a second directional axis DR2. A normal direction of the display area DA (i.e., a thickness direction of the display device DD) is indicated as a third directional axis DR3. A front surface (or top surface) and a rear surface (or bottom surface) of each of members is distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively.

The shape of the display area DA illustrated in FIG. 1 is merely an example, and the shape of the display area DA may be changed without restriction as necessary.

The non-display area NDA is an area which is adjacent to the display area DA and on which the image IM is not displayed. A bezel area of the display device DD may be defined by the non-display area NDA.

The non-display area NDA may surround the display area DA. However, the embodiments of the inventive concept are not limited thereto. For example, the display area DA and the non-display area NDA may be relatively designed in shape.

FIGS. 2A to 2D are cross-sectional views of the display device according to some example embodiments of the inventive concept. FIGS. 2A to 2D illustrate cross-sections defined by the second directional axis DR2 and the third directional axis DR3. FIGS. 2A to 2D are simply illustrated to explain a lamination relationship of functional panels and/or functional members constituting the display device DD.

Figure 2A:
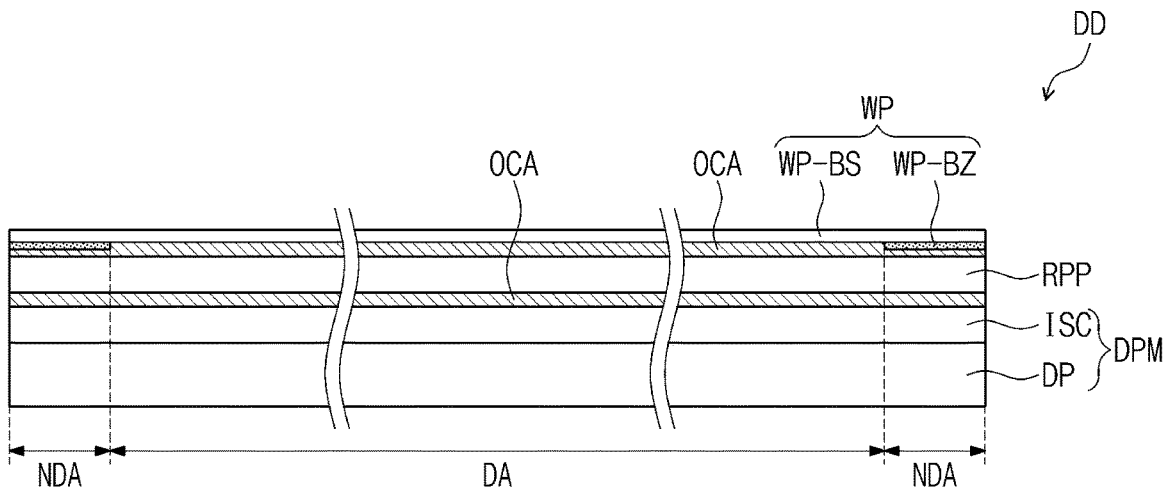
FIGS. 2A, 2B, 2C, and 2D are cross-sectional views of the display device according to some example embodiments of the inventive concept.

As illustrated in FIG. 2A, the display device DD includes a display panel DP, an input sensing circuit ISC, an antireflection member RPP, and a window member WP. The input sensing circuit ISC may be directly located on the display panel DP. In this specification, "directly located" means that a separate adhesion layer/adhesion member is not located between two components.

The display module DPM may include the display panel DP and the input sensing circuit ISC that is directly located on the display panel DP. An optical clear adhesion member OCA may be located between the display module DPM and the antireflection member RPP and between the antireflection member RPP and the window member WP.

The display panel DP generates an image, and the input sensing circuit ISC acquires coordinate information of an external input (for example, a touch event or an applied pressure). According to some example embodiments, the display module DPM may further include a protection member located on a bottom surface of the display panel DP.

The protection member and the display panel DP may be coupled to each other through an adhesion member. The display devices DD of FIGS. 2B to 2D, which will be described in more detail below, may also further include the protection member.

The display panel DP according to some example embodiments of the inventive concept may be an emission type display panel. For example, the display panel DP may be an organic light emitting display panel, a quantum dot light emitting display panel, or a micro LED display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

The antireflection member RPP reduces reflectance of external light incident from an upper side of the window member WP. The antireflection member RPP according to an embodiment of the inventive concept may include a retarder and a polarizer.

The antireflection member RPP according to some example embodiments of the inventive concept may include color filters.

The window member WP according to some example embodiments of the inventive concept includes a base film WP-BS and a light blocking pattern WP-BZ. The base film WP-BS may include glass and/or a synthetic resin. The base film WP-BS is not limited to a single layer. The base film WP-BS may include two or more films that are coupled to each other through the adhesion member.

The light blocking pattern WP-BZ partially overlaps the base film WP-BS. The light blocking pattern WP-BZ may be located on a rear surface of the base film WP-BS to define a bezel area of the display device DD, that is, a non-display area NDA.

Hereinafter, the light blocking pattern WP-BZ and the base film WP-BS are not separately illustrated in FIGS. 2B to 2D.

Figure 2B:
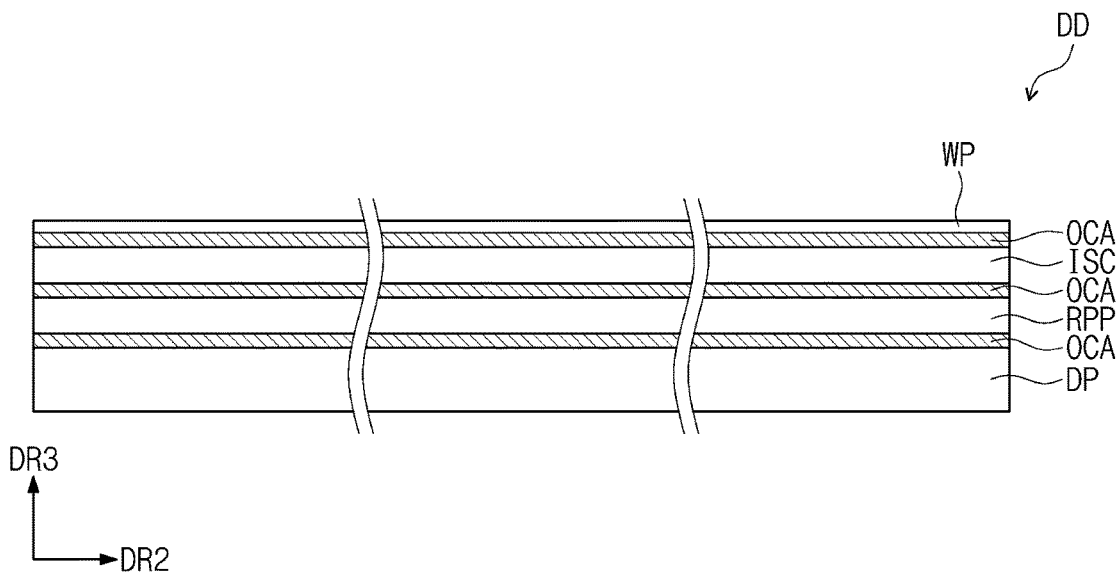

As illustrated in FIG. 2B, the display device DD may include the display panel DP, the antireflection member RPP, the input sensing circuit ISC, and the window member WP.

The display panel DP and the antireflection member RPP may be coupled to each other through the optical clear adhesion member OCA. The antireflection member RPP and the input sensing circuit ISC may be coupled to each other through the optical clear adhesion member OCA. The input sensing circuit ISC and the window member WP may be coupled to each other through the optical clear adhesion member OCA.

Figure 2C:
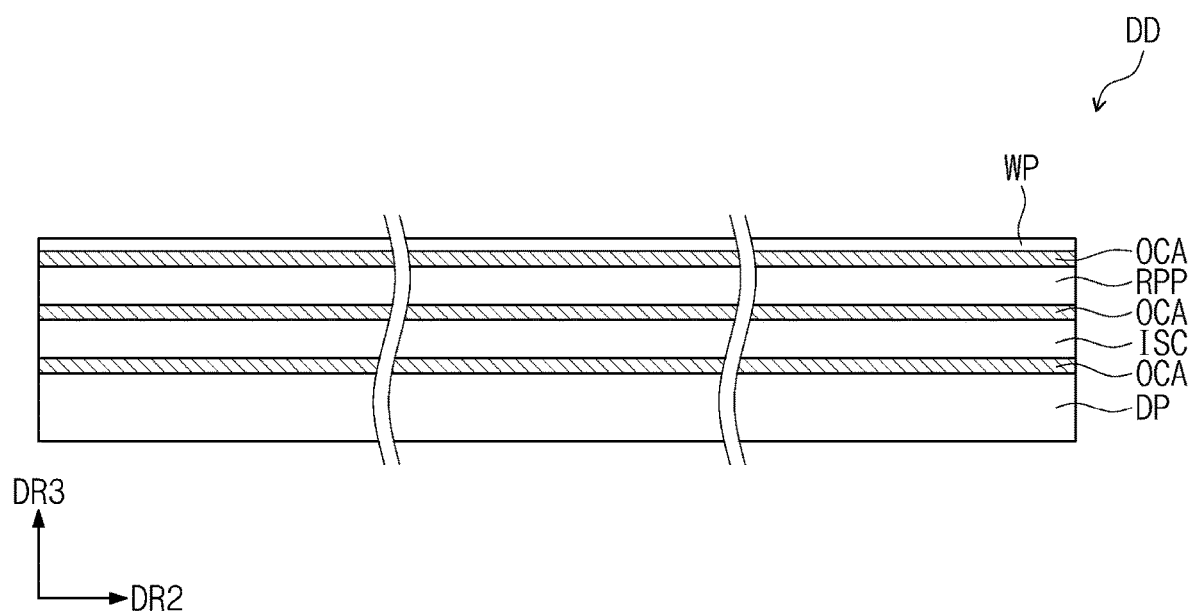

Referring to FIG. 2C, unlike the laminated structure of FIG. 2, the positions of the antireflection member RPP and the input sensing circuit ISC are exchanged.

Figure 2D:
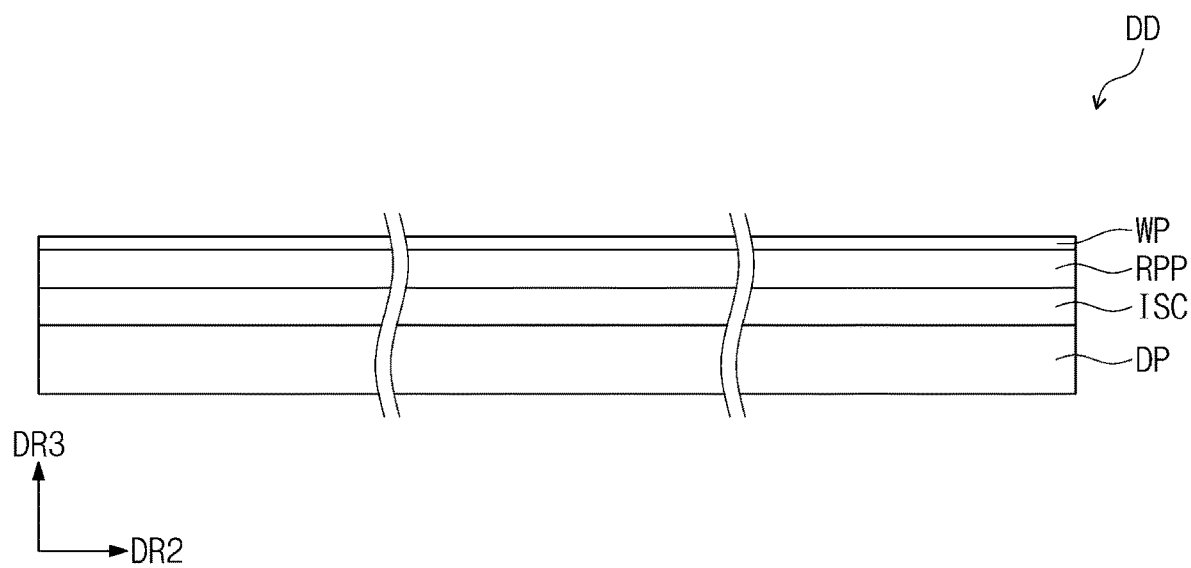

As illustrated in FIG. 2D, in the display device DD, the adhesion members may be omitted, and the display panel DP, the input sensing circuit ISC, the antireflection member RPP, and the window member WP may be formed through a continuous process. According to some example embodiments of the inventive concept, a laminated order of the input sensing circuit ISC and the antireflection member RPP may be changed.

The input sensing circuit ISC may be a circuit that senses user's touch or senses a pressure applied from the outside.

Figure 3:
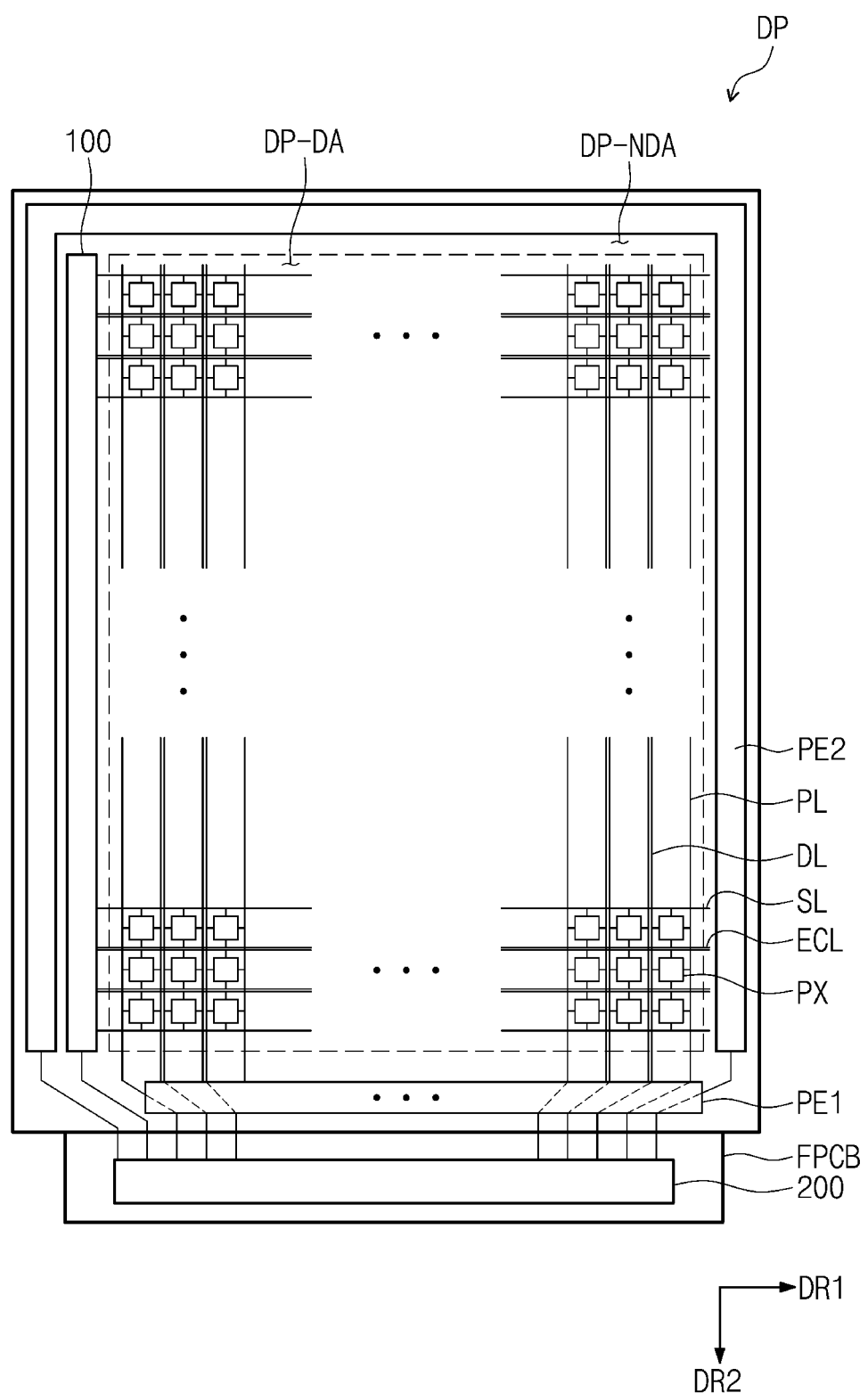
FIG. 3 is a plan view of a display panel according to some example embodiments of the inventive concept.

FIG. 3 is a plan view of the display panel DP according to some example embodiments of the inventive concept.

The display panel DP includes a display area DP-DA and a non-display area DP-NDA on a plane. According to some example embodiments, the non-display area DP-NDA may be defined along an edge of the display area DP-DA. The display area DP-DA and the non-display area DP-NDA of the display panel DP may correspond to the display area DD and the non-display area NDA of the display device DD of FIG. 1, respectively.

The display panel DP may include a scan driving unit 100, a data driving unit 200, a plurality of scan lines SL, a plurality of emission control lines ECL, a plurality of data lines DL, a plurality of power lines PL, a first power electrode PE1, a second power electrode PE2, and a plurality of pixels PX (hereinafter, referred to as pixels). The pixels PX are located on the display area DP-DA. Each of the pixels PX includes an organic light emitting element OLED (see FIG. 4) and a pixel circuit CC (see FIG. 4) connected to the organic light emitting element OLED.

The scan driving unit 100 may include a scan driving unit and an emission control driving unit.

The scan driving unit generates scan signals to sequentially output the generated scan signals to the scan lines SL. The emission control driving unit generates emission control signals to output the generated emission control signals to the emission control lines SL.

According to some example embodiments of the inventive concept, the scan driving unit and the emission control driving unit may be provided as one circuit in the scan driving unit 100 without being divided from each other.

The scan driving unit 100 may include a plurality of thin film transistors that are manufactured through the same process as the driving circuit of the pixel PX, e.g., a low temperature polycrystalline silicon (LTPS) process or a low temperature polycrystalline oxide (LTPO) process.

The data driving unit 200 outputs data signals to the data lines DL. The data signals are analog voltages corresponding to gray level values of the image data.

According to some example embodiments of the inventive concept, the data driving unit 200 may be mounted on a printed circuit board FPCB, and the printed circuit board FPCB may be connected to pads located on one end of the data lines DL. However, the embodiment of the inventive concept is not limited thereto. For example, the data driving unit 200 may be directly mounted on the display panel DP.

The scan line SL may extend in the first direction DR1 and may be arranged in the second direction DR2.

The light emitting control lines ECL may extend in the first direction DR1 and may be arranged in the second direction DR2. That is, each of the emission control lines ECL may be located in parallel to the corresponding scan line of the scan lines SL.

The data lines DL extend in the second direction DR2 and are arranged in the first direction DR1. The data lines DL may provide data signals to the corresponding pixels PX.

The power lines PL extend in the second direction DR2 and are arranged in the first direction DR1. The power lines PL may provide first power ELVDD (see, e.g., FIG. 4) received from the first power electrode PE to the corresponding pixels PX.

The first power electrode PE1 may be an electrode transmitting the first power ELVDD (see, e.g., FIG. 4) to the pixel PX, and the second power electrode PE2 may be an electrode transmitting second power ELVSS (see, e.g., FIG. 4) to the pixel PX.

Each of the plurality of pixels PX is connected to the corresponding scan line of the scan lines SL, the corresponding emission control line of the emission control lines ECL, the corresponding data line of the data lines DL, and the corresponding power line of the power lines PL.

Figure 4:
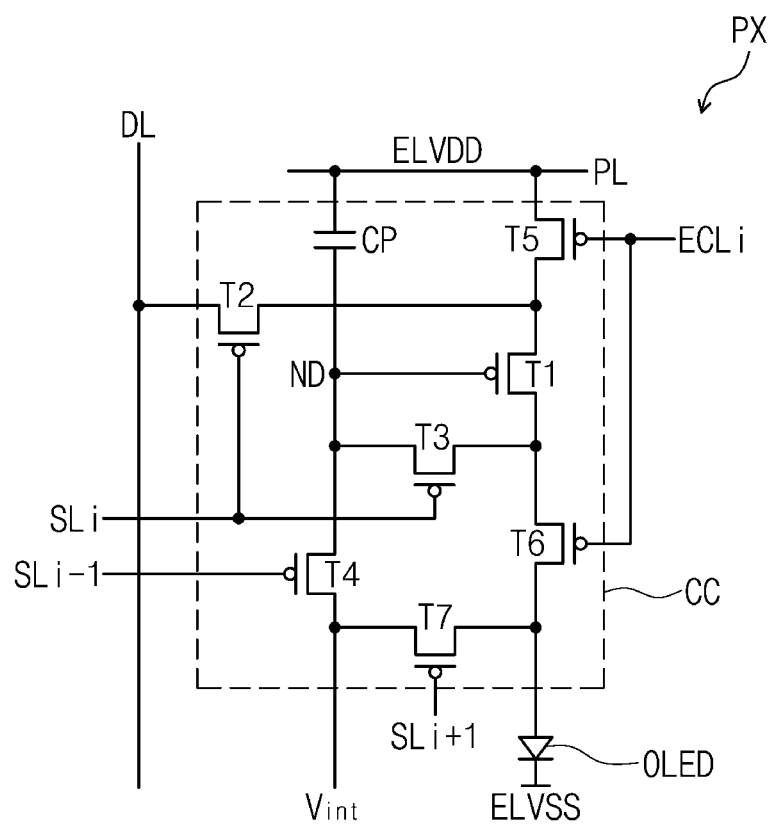
FIG. 4 is an equivalent circuit diagram of a pixel according to some example embodiments of the inventive concept.
Figure 5:
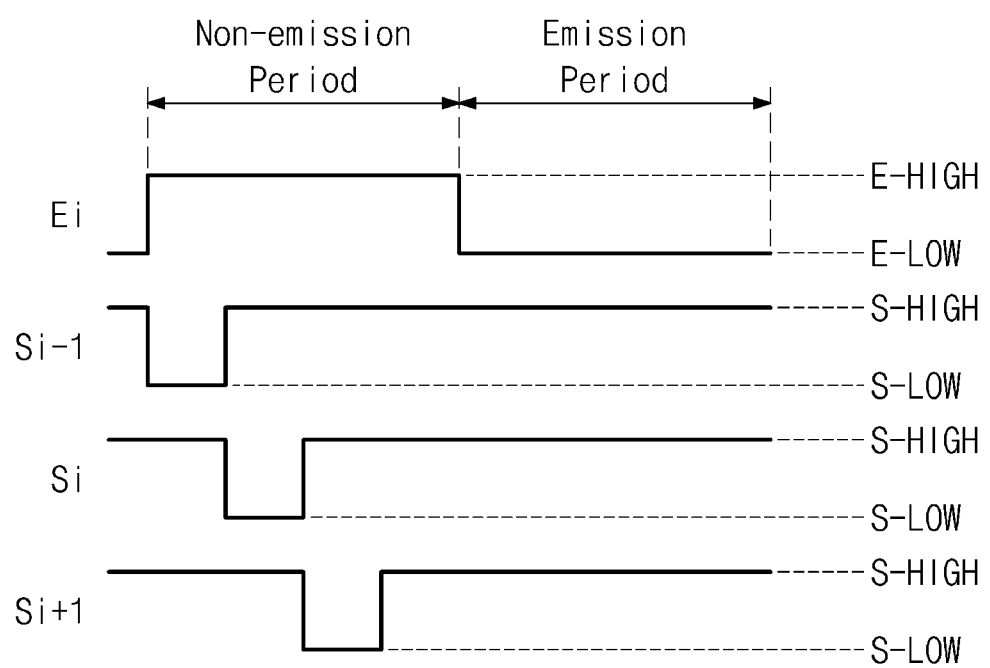
FIG. 5 is a view of signals applied to the pixel of FIG. 4.

FIG. 4 is an equivalent circuit diagram of the pixel PX according to some example embodiments of the inventive concept. FIG. 5 is a view illustrating an example of an emission control signal Ei and scan signals Si−1, Si, and Si+1, which are applied to the pixel PX of FIG. 4. FIG. 4 illustrates an example of the pixel PX connected to an i-th scan line SLi and an i-th emission control line ECLi.

The pixel PX may include an organic light emitting diode OLED and a pixel circuit CC. The pixel circuit CC may include a plurality of transistors T1 to T7 and a capacitor CP. The pixel circuit CC controls an amount of current flowing through the organic light emitting diode OLED in response to the data signal.

The organic light emitting diode OLED may emit light at a luminance (e.g., a predetermined luminance) corresponding to an amount of current supplied from the pixel circuit CC. For this, the first power ELVDD may be set to a level greater than that of the second power ELVSS.

Each of the transistors T1 to T7 may include an input electrode (or a source electrode), an output electrode (or a drain electrode), and a control electrode (or a gate electrode). In this specification, for convenience, either the input electrode or the output electrode may be referred to as a first electrode and the other may be referred to as a second electrode.

The first electrode of the first transistor T1 is connected to the first power ELVDD via the fifth transistor T5, and the second electrode is connected to an anode electrode of the organic light emitting diode OLED via the sixth transistor T6. The first transistor T1 may be called a driving transistor in this specification.

The first transistor T1 controls an amount of current flowing through the organic light emitting diode OLED corresponding to a voltage applied to the control electrode.

The second transistor T2 is connected between the data lien DL and the first electrode of the first transistor T1. Also, the control electrode of the second transistor T2 is connected to an i-th scan line SLi. When an i-th scan signal Si is applied to the i-th scan line SLi, the second transistor T2 may be turned on to electrically connect the data line DL to the first electrode of the first transistor T1.

The third transistor T3 is connected between the second electrode of the first transistor T1 and the control electrode. The control electrode of the third transistor T3 is connected to the i-th scan line SLi. When the i-th scan signal Si is applied to the i-th scan line SLi, the third transistor T3 may be turned on to electrically connect the second electrode of the first transistor T1 to the control electrode. Thus, when the third transistor T3 is turned on, the first transistor T1 is connected in the form of a diode.

The fourth transistor T4 is connected between a node ND and an initialization power generation unit. Also, the control electrode of the fourth transistor T4 is connected to an (i−1)-th scan line SLi−1. When an (i−1)-th scan signal Si−1 is provided to the (i−1)-th scan line SLi−1, the fourth transistor T4 is turned on to provide an initialization voltage Vint to the node ND.

The fifth transistor T5 is connected between the power line PL and the first electrode of the first transistor T1. The control electrode of the fifth transistor T5 is connected to an i-th emission control line ECLi.

The sixth transistor T6 is connected between the second electrode of the first transistor T1 and the anode electrode of the organic light emitting diode OLED. Also, the control electrode of the sixth transistor T6 is connected to the i-th emission control line ECLi.

The seventh transistor T7 is connected between the initialization power generation unit and the anode electrode of the organic light emitting diode OLED. Also, the control electrode of the seventh transistor T7 is connected to an (i+1)-th scan line SLi+1. When the (i+1)-th scan signal Si+1 is provided to the (i+1)-th scan line SLi+1, the seventh transistor T7 is turned on to provide the initialization voltage Vint to the anode electrode of the organic light emitting diode OLED.

The seventh transistor T7 may improve black display capability of the pixel PX. For example, when the seventh transistor T7 is turned on, a parasitic capacitor of the organic light emitting diode OLED is discharged. Thus, when black luminance is implemented, the organic light emitting diode OLED does not emit light due to leakage current from the first transistor T1, and thus, the black display capability may be improved.

Additionally, although the control electrode of the seventh transistor T7 is connected to the (i+1)-th scan line SLi+1 in FIG. 4, the embodiment of the inventive concept is not limited thereto. In another embodiment of the inventive concept, the control electrode of the seventh transistor T7 may be connected to the i-th scan line SLi or the (i−1)-th scan line SLi−1.

Although a PMOS is illustrated in FIG. 4, the embodiments of the inventive concept are not limited thereto. In another embodiment of the inventive concept, the pixel PX may be constituted by an NMOS. According to some example embodiments of the inventive concept, the pixel PX may be constituted by a combination of the NMOS and the PMOS.

The capacitor CP is located between the power line PL and the node ND. The capacitor CP stores a voltage corresponding to the data signal. When the fifth transistor T5 and the sixth transistor T6 are turned on according to the voltage stored in the capacitor CP, an amount of current flowing through the first transistor T1 may be determined.

According to some example embodiments of the inventive concept, a structure of the pixel PX is not limited to the structure of FIG. 4. A pixel according to some example embodiments of the inventive concept may have various shapes to allow the organic light emitting diode OLED to emit light.

Referring to FIG. 5, an emission control signal Ei may have a high level E-HIGH and a low level E-LOW. Each of the scan signals SLi−1, SLi, and SLi+1 may have a high level S-HIGH and a low level S-LOW.

When the emission control signal Ei has th high level E-HIGH, the fifth transistor T5 and the sixth transistor T6 may be turned off. When the fifth transistor T5 is turned off, the power line PL and the first electrode of the first transistor T1 are electrically interrupted. When the sixth transistor T6 is turned off, the second electrode of the first transistor T1 and the anode electrode of the organic light emitting diode OLED are electrically interrupted. Thus, the organic light emitting diode OLED does not emit light during a period for which the emission control signal Ei having the high level E-HIGH is provided to the i-th emission control line ECLi.

Thereafter, when the (i−1)-th scan signal Si−1 provided to the (i−1)-th scan line SLi−1 has the low level S-LOW, the fourth transistor T4 is turned off. When the fourth transistor T4 is turned on, the initialization voltage Vint is provided to the node ND.

When the i-th scan signal Si provided to the i-th scan line SLi has the low level S-LOW, the second transistor T2 and the third transistor T3 are turned on.

When the second transistor T2 is turned on, the data signal is provided to the first electrode of the first transistor T1. Here, because the node ND is initialized to the initialization voltage Vint, the first transistor T1 is turned on. When the first transistor T1 is turned on, a voltage corresponding to the data signal is provided to the node ND. Here, the capacitor CP stores a voltage corresponding to the data signal.

When the (i+1)-th scan signal Si+1 provided to the (i+1)-th scan line SLi+1 has the low level S-LOW, the seventh transistor T7 is turned on.

When the seventh transistor T7 is turned on, the initialization voltage Vint is provided to the anode electrode of the organic light emitting diode OLED to discharge the parasitic capacitance of the organic light emitting diode OLED.

When the emission control signal Ei provided to the emission control line ECLi has the low level E-LOW, the fifth transistor T5 and the sixth transistor T6 are turned on. When the fifth transistor T5 is turned on, the power ELVDD is provided to the first electrode of the first transistor T1. When the sixth transistor T6 is turned on, the second electrode of the first transistor T1 and the anode electrode of the organic light emitting diode OLED are electrically connected to each other. Thus, the organic light emitting diode OLED may generate light having a luminance (e.g., a predetermined luminance) corresponding to an amount of provided current.

Figure 6:
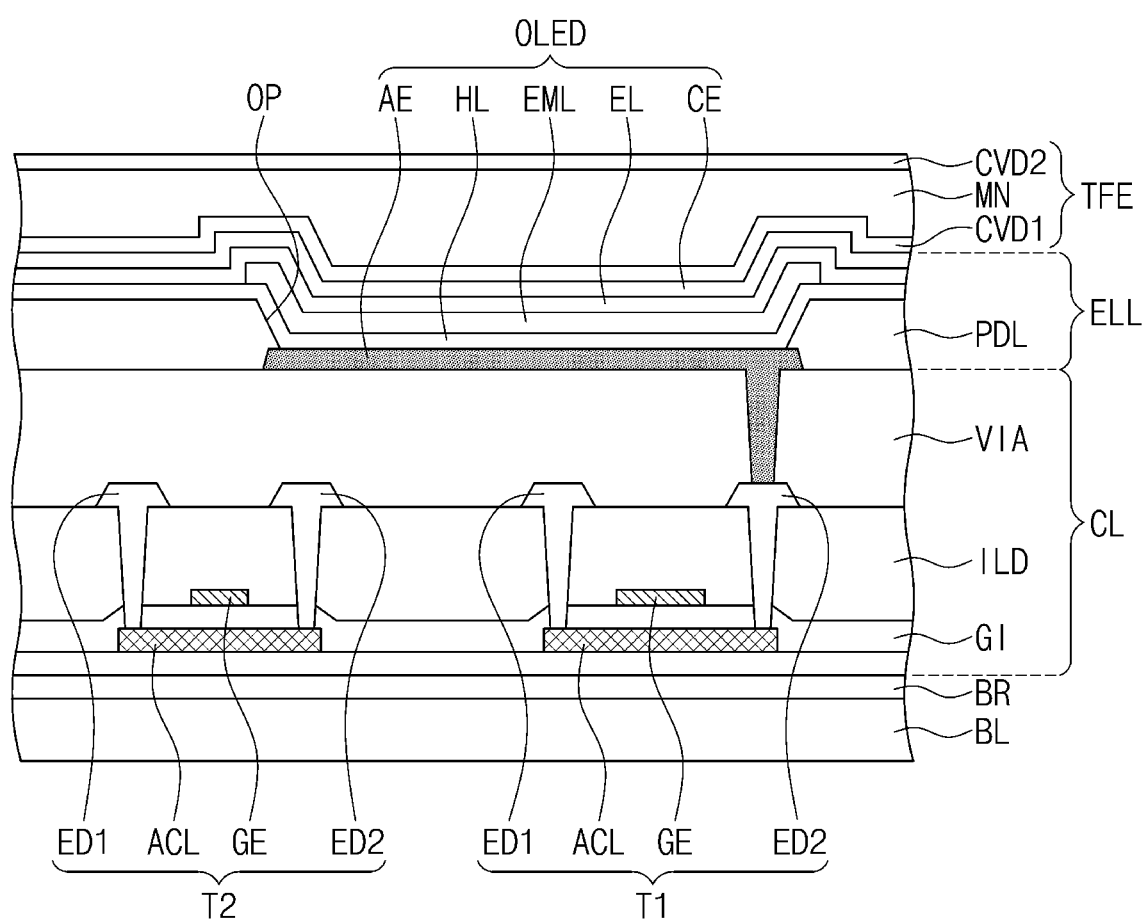
FIG. 6 is a cross-sectional view illustrating a portion of the pixel according to some example embodiments of the inventive concept.

FIG. 6 is a cross-sectional view illustrating a portion of the pixel PX (see FIG. 4) according to an embodiment of the inventive concept. Although the first transistor T1 and the second transistor T2 are illustrated as an example in FIG. 6, a structure of each of the first and second transistors T1 and T2 is not limited thereto. Although a second electrode ED2 of the first transistor T1 directly contacts the anode electrode of the pixel PX in FIG. 6, this is merely a shape in cross-section. That is, as illustrated in FIG. 6, according to some example embodiments, the first transistor T1 may be actually connected to the anode electrode AE of the pixel PX via the sixth transistor T6. However, the embodiments of the inventive concept are not limited thereto. For example, according to some example embodiments, the second electrode ED2 of the first transistor T1 may directly contact the anode electrode AE of the pixel PX.

The display panel DP (see, e.g., FIG. 3) may include a base layer BL, a circuit layer CL, a light emitting element layer ELL, and an encapsulation layer TFE.

The circuit layer CL may include a barrier layer BR, a buffer layer BF, gate insulation layers GI, an interlayer dielectric, a circuit insulation layer IVA, and transistors T1 and T2.

The light emitting element layer ELL may include an organic light emitting element OLED and a pixel defining layer PDL.

The encapsulation layer TFE may seal the light emitting element layer ELL to protect the light emitting element layer ELL against external oxygen or moisture.

The encapsulation layer TFE may include a first inorganic layer CVD1 an organic layer MN, and a second inorganic layer CVD2. Although the encapsulation layer TFE includes two inorganic layers and one organic layer in FIG. 6, the embodiments of the inventive concept are not limited thereto. For example, the encapsulation layer TFE may include three inorganic layers and two organic layers. In this case, the inorganic layers and the organic layers may be alternately laminated. The functional layers BR and BF may be located on one surface of the base layer BL. The functional layers BR and BF may include the barrier layer BR and the buffer layer BF.

The functional layers BR and BF may prevent or reduce instances of impurities existing on the base layer BL being introduced into the pixel PX during the manufacturing process. For example, the buffer layer BF may prevent or reduce instances of the impurities being diffused into active parts ACL of the transistors T1 and T2 constituting the pixel PX.

The impurities may be introduced from the outside or generated while the base substrate BL is pyrolyzed. The impurities may be a gas or sodium discharged from the base substrate BL. Also, the functional layers BR and BF may block moisture introduced from the outside into the pixel PX.

The active parts ACL constituting each of the transistors T1 and T2 are located on the buffer layer BF. Each of the active parts ACL may include polysilicon or amorphous silicon. In addition, each of the active parts ACL may a metal oxide semiconductor.

Each of the active parts ACL may include a channel region serving as a passage through which electrons or holes move and first and second ion-doped regions located with the channel region therebetween.

The gate insulation layer GI covering the active parts ACL is located on the buffer layer BF. The gate insulation layer GI includes an organic layer and/or an inorganic layer. The gate insulation layer GI may include a plurality of inorganic thin films. The plurality of inorganic thin films may include a silicon nitride layer and a silicon oxide layer.

Control electrodes GE constituting each of the transistors T1 and T2 are located on the gate insulation layer GI. At least a portion of the scan lines SL (see, e.g., FIG. 3) and the emission control lines ECL (see, e.g., FIG. 3) may be located on the gate insulation layer GI.

The interlayer dielectric ILD covering the control electrodes GE may be located on the gate insulation layer GI. The interlayer dielectric ILD includes an organic layer and/or an inorganic layer. The interlayer dielectric ILD may include a plurality of inorganic thin films or organic thin films. The plurality of inorganic thin films may include a silicon nitride layer and a silicon oxide layer.

At least a portion of the data line DL (see, e.g., FIG. 3) and the power line PL (see, e.g., FIG. 3) may be located on the interlayer dielectric ILD. First electrode ED1 and second electrodes ED2 of each of the transistors T1 and T2 may be located on the interlayer dielectric ILD.

The first electrodes ED1 and the second electrodes ED2 may be connected to the corresponding active parts ACL through through-holes passing through the gate insulation layer GI and the interlayer dielectric ILD, respectively.

A circuit insulation layer VIA covering the first electrodes ED1 and the second electrodes ED2 is located on the interlayer dielectric ILD. The circuit insulation layer VIA includes an organic layer and/or an inorganic layer. The circuit insulation layer VIA may provide a flat surface. The circuit insulation layer VIA may be located between the anode electrode AE and the transistors T1 and T2. The pixel defining layer PDL and the organic light emitting element OLED may be located on the circuit insulation layer VIA.

The organic light emitting element OLED may include an anode electrode AE, a hole control layer HL, a light emitting layer EML, an electronic control layer EL, and a cathode electrode CE.

The anode electrode AE may be connected to the second electrode ED2 through a contact hole passing through the circuit insulation layer VIA.

An opening OP defined in the pixel defining layer may expose the anode electrode AE.

Figure 7:
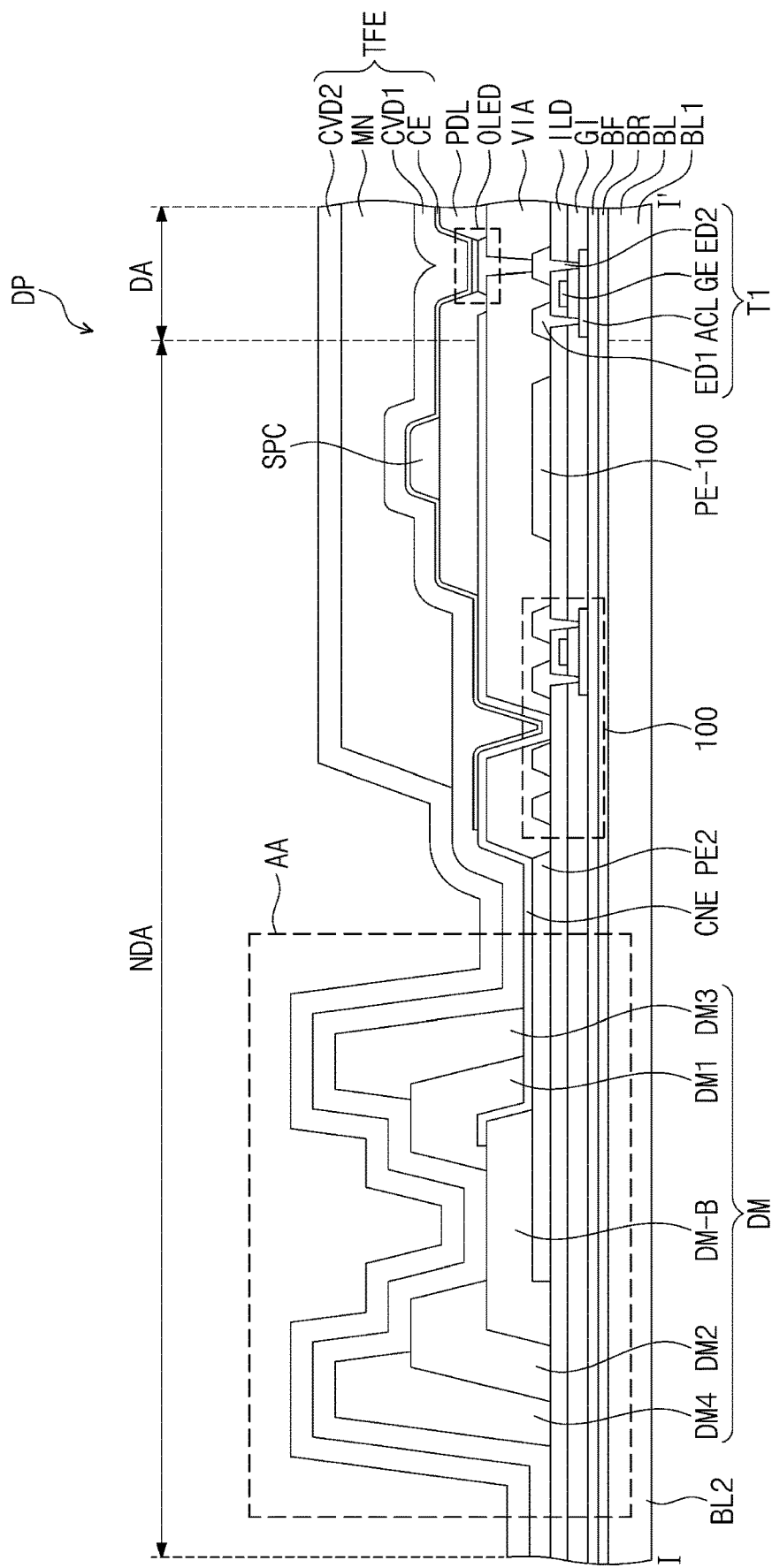
FIG. 7 is a cross-sectional view illustrating an example of a portion corresponding to the display panel, taken along the line I-I' of FIG. 1.
Figure 8:
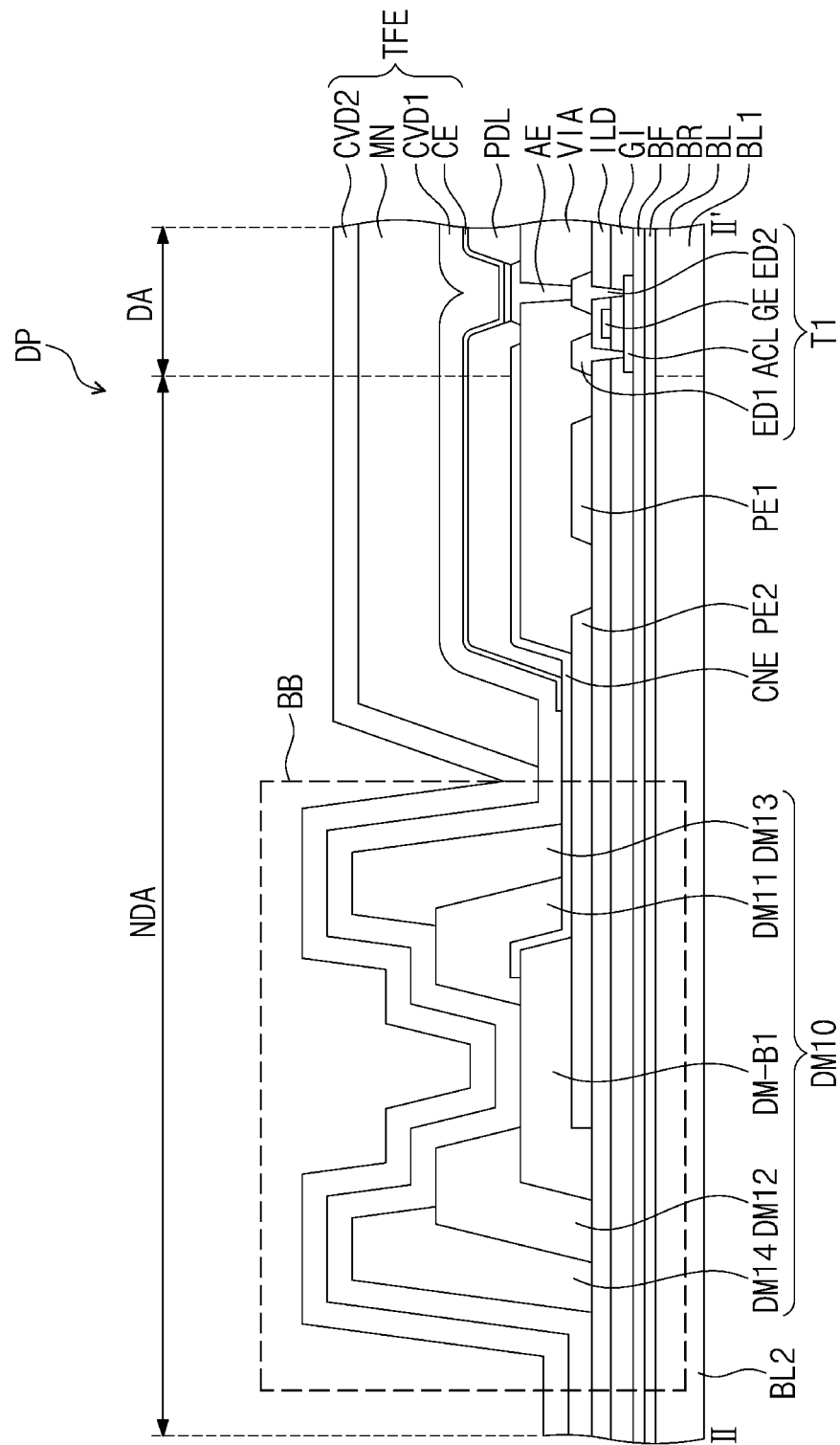
FIG. 8 is a cross-sectional view illustrating an example of a portion corresponding to the display panel, taken along line the II-II' of FIG. 1.
Figure 9:
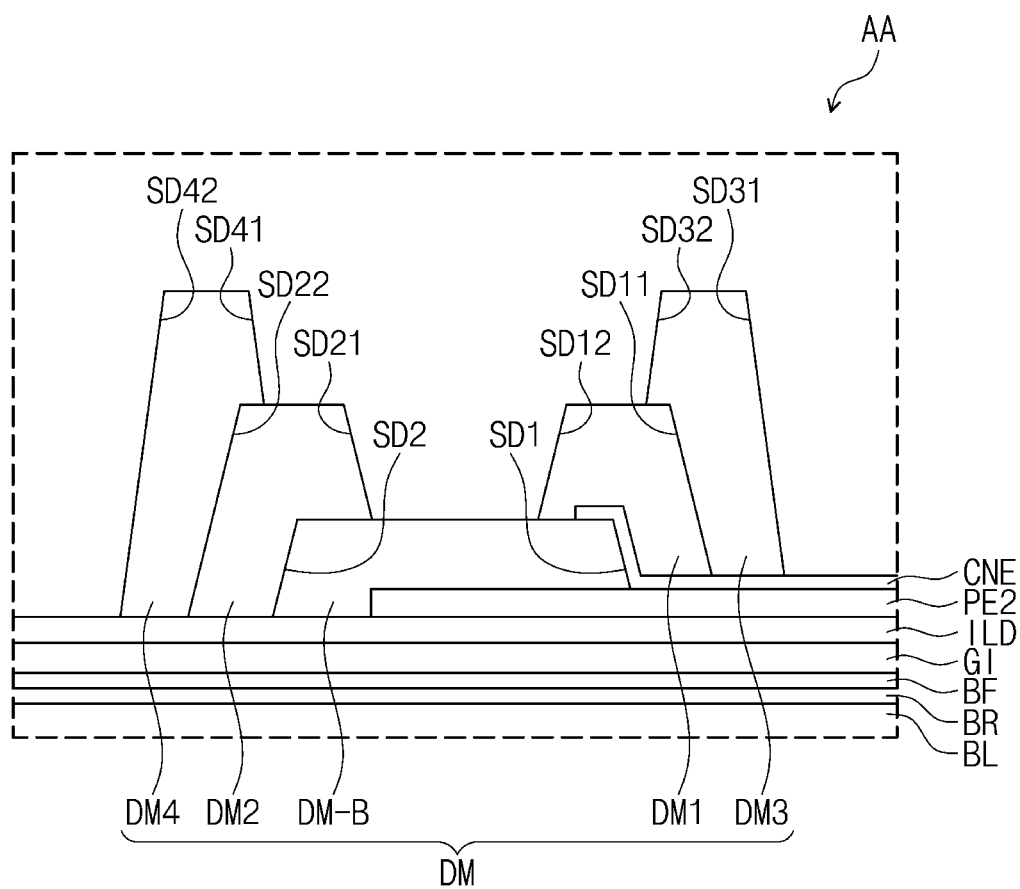
FIG. 9 is an enlarged view of a region AA of FIG. 7.

FIG. 7 is a cross-sectional view illustrating an example of a portion corresponding to the display panel DP, taken along the line I-I' of FIG. 1. FIG. 8 is a cross-sectional view illustrating an example of a portion corresponding to the display panel DP, taken along the line II-II' of FIG. 1. FIG. 9 is an enlarged view of a region AA of FIG. 7. In FIG. 9, for convenience of description, the first inorganic layer CVD1 and the second inorganic layer CVD2 are not illustrated.

Referring to FIG. 7, the base layer BL may include a first area BL1 corresponding to the display area DA and a second area BL2 corresponding to the non-display area NDA.

A partition wall DM may be located on the second area BL2. The first inorganic layer CVD1 may cover the cathode electrode CE. The first inorganic layer CVD1 may extend up to an area on which the partition wall DM is located to cover the partition wall DM. To control a flow of the organic material applied to the first inorganic layer CVD1, hydrophobic or hydrophilic plasma treatment may be performed on the first inorganic layer CVD1.

The organic layer MN may be located on the first inorganic layer CVD1 to overlap the cathode electrode CE. The organic layer MN may be formed by depositing, printing, or applying an organic material.

The second inorganic layer CVD2 may cover the organic layer MN. The second inorganic layer CVD2 may extend up to an area on which the partition wall DM is arranged to cover the partition wall DM.

A spacer SPC may be located on the pixel defining layer PDL. The spacer SPC may be a component preventing a portion of the display panel DP from being damaged by a mask in the manufacturing process.

Referring to the region AA of FIG. 7 and FIG. 9, the partition wall DM may include a base dam DM-B, a first dam DM1, a second dam DM2, a third dam DM3, and a fourth dam DM4.

The base dam DM-B may include a first side SD1 and a second side SD2. A distance between the first side SD1 and the organic light emitting element OLED is less than that between the second side SD2 and the organic light emitting element OLED. That is, the first side SD1 may be closer to the organic light emitting element OLED than the second side SD2.

The first dam DM1 may include a first side SD11 and a second side SD12. A distance between the first side SD11 and the organic light emitting element OLED is less than that between the second side SD12 and the organic light emitting element OLED. That is, the first side SD11 may be closer to the organic light emitting element OLED than the second side SD12.

The second dam DM2 may include a first side SD21 and a second side SD22. A distance between the first side SD21 and the organic light emitting element OLED is less than that between the second side SD22 and the organic light emitting element OLED. That is, the first side SD21 may be closer to the organic light emitting element OLED than the second side SD22.

The third dam DM3 may include a first side SD31 and a second side SD32. A distance between the first side SD31 and the organic light emitting element OLED is less than that between the second side SD32 and the organic light emitting element OLED. That is, the first side SD31 may be closer to the organic light emitting element OLED than the second side SD32.

The fourth dam DM4 may include a first side SD41 and a second side SD42. A distance between the first side SD41 and the organic light emitting element OLED is less than that between the second side SD42 and the organic light emitting element OLED. That is, the first side SD41 may be closer to the organic light emitting element OLED than the second side SD42.

The base dam DM-B may cover one side of the second power electrode PE2. The base dam DM-B may be formed through the same process as the circuit insulation layer VIA. Thus, the base dam DM-B may include the same material as the circuit insulation layer VIA.

The connection electrode CNE may be located on the first side SD1 of the base dam DM-B and a portion of the second power electrode PE2, which is not covered by the base dam DM-B. The connection electrode CNE may be formed through the same process as the anode electrode AE. Thus, the connection electrode CNE may include the same material as the anode electrode AE.

The first dam DM1 may cover the first side SD1 of the base dam DM-B and one side of the connection electrode CNE.

The second dam DM2 may be spaced apart from the first dam DM1 and cover the second side SD2 of the base dam DM-B.

The first dam DM1 and the second dam DM2 may be formed through the same process as the pixel defining layer PDL. Thus, each of the first dam DM1 and the second dam DM2 may include the same material as the pixel defining layer PDL.

The third dam DM3 may cover the first side SD11 of the first dam DM1 and a portion of the connection electrode CNE.

The fourth dam DM4 may be spaced apart from the third dam DM3 and cover the second side SD22 of the second dam DM2.

The third dam DM3 and the fourth dam DM4 may be formed through the same process as the spacer SPC. Thus, each of the third dam DM3 and the fourth dam DM4 may include the same material as the spacer SPC.

According to some example embodiments of the inventive concept, first, the first dam DM1 and the second dam DM2 may prevent the organic layer MN of the encapsulation layer TFE from being diffused up to an unnecessary portion. Thereafter, the organic layer MN of the encapsulation layer TFE may be prevented from being diffused up to the unnecessary portion by a space between the first dam DM1 and the second dam DM2 and a space between the third dam DM3 and the fourth dam DM4.

Referring to a region BB of FIG. 8, a partition wall DM10 may be located on the second area BL2. The partition wall DM10 may include a base dam DM-B1, a first dam DM11, a second dam DM12, a third dam DM13, and a fourth dam DM14.

Although an initialization electrode PE-100 adjacent to the first transistor T1 to provide the initialization voltage Vint (see, e.g., FIG. 4) is located in FIG. 7, the first power electrode PE1 adjacent to the first transistor T1 to provide the first power ELVDD (see, e.g., FIG. 4) may be located in FIG. 8.

That is, the scan driving unit 100 and the initialization electrode PE-100 may be located between the second electrode PE2 and the first transistor T1 in FIG. 7, and the first power electrode PE1 may be located between the second electrode PE2 and the first transistor T1 in FIG. 8.

An arrangement relationship of the base dam DM-B, the first dam DM1, the second dam DM2, the third dam DM3, and the fourth dam DM4, which are illustrated in the region AA of FIG. 7, may be substantially the same as that of the base dam DM-B1, the first dam DM11, the second dam DM12, the third dam DM13, and the fourth dam DM14, which are illustrated in the region BB of FIG. 8.

Descriptions with respect to the components of FIG. 8 are substantially the same as those of the components of FIGS. 7 to 9 and thus will be omitted.

Figure 10:
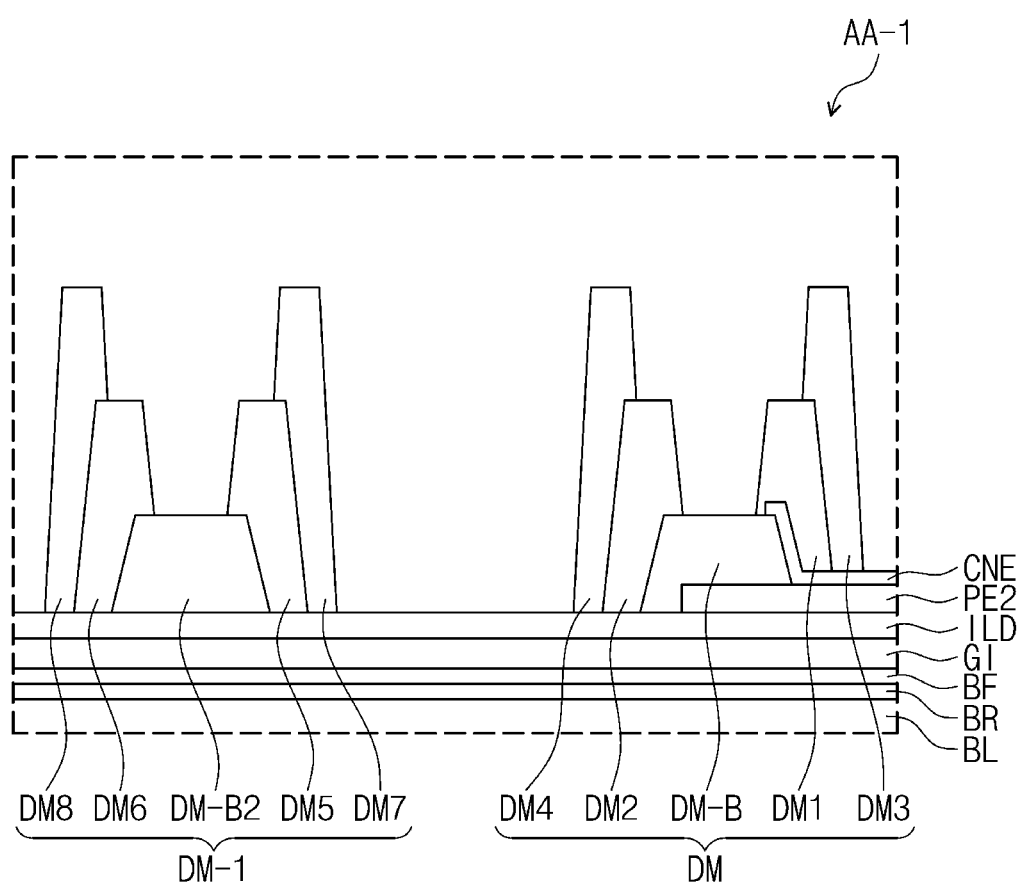
FIG. 10 is a view illustrating a modified example of the region AA of FIG. 9.

FIG. 10 is a view illustrating a modified example of the region AA of FIG. 9. In FIG. 10, for convenience of description, the first inorganic layer CVD1 and the second inorganic layer CVD2 are not illustrated.

Referring to a region AA-1 of FIG. 10, the display panel DP according to some example embodiments of the inventive concept may further include a second partition wall DM-1 located on the second area BL2.

The second partition wall DM-1 may include a second base dam DM-B2, a fifth dam DM5, a sixth dam DM6, a seventh dam DM7, and an eighth dam DM8.

The fifth dam DM5 may cover one side of the second base dam DM-B2.

The sixth dam DM6 may be spaced apart from the fifth dam DM5 and cover the other side of the second base dam DM-B2.

The seventh dam DM7 may cover one side of the fifth dam DM5.

The eighth dam DM8 may be spaced apart from the seventh dam DM7 and cover one side of the sixth dam DM6.

The second base dam DM-B2 may be formed through the same process as the base dam DM-B. Thus, the second base dam DM-B2 may include the same material as the base dam DM-B.

The fifth dam DM5 and the sixth dam DM6 may be formed through the same process as the first dam DM1 and the second dam DM2. Thus, the fifth dam DM5 and the sixth dam DM6 may include the same material as the first dam DM1 and the second dam DM2.

The seventh dam DM7 and the eighth dam DM8 may be formed through the same process as the third dam DM3 and the fourth dam DM4. Thus, the seventh dam DM7 and the eighth dam DM8 may include the same material as the third dam DM3 and the fourth dam DM4.

Figure 11:
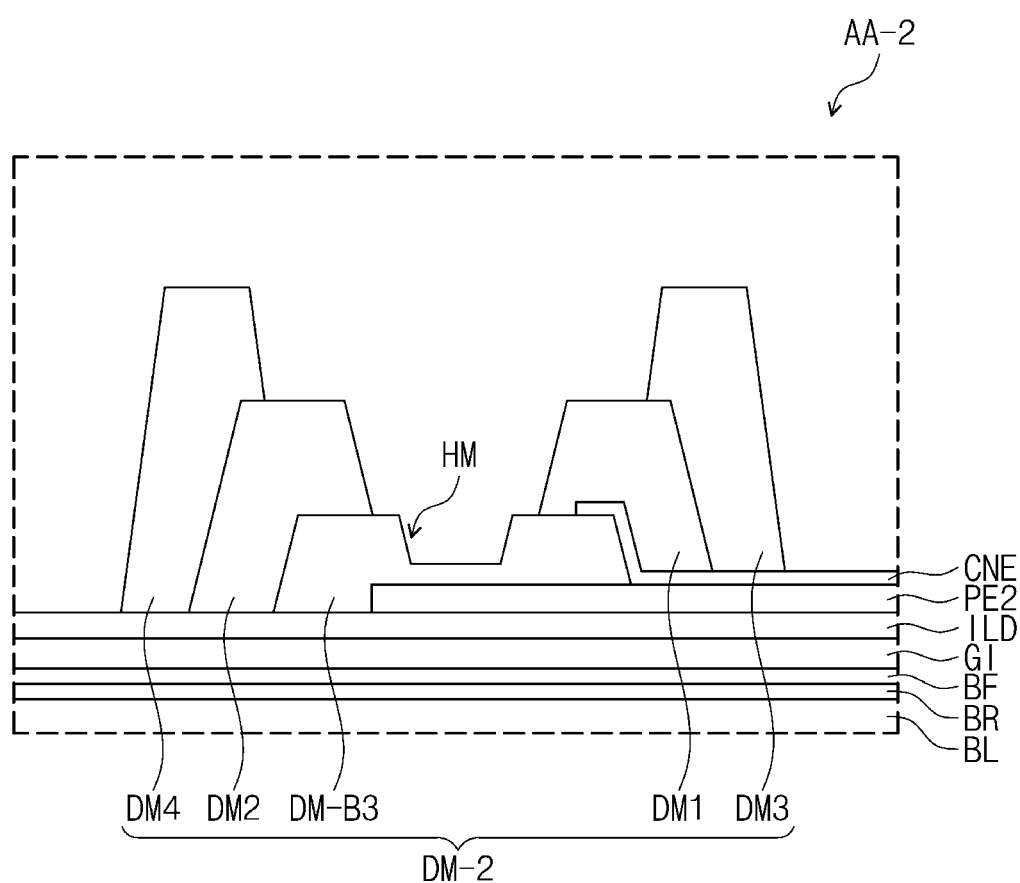
FIG. 11 is a view illustrating a modified example of the region AA of FIG. 9.

FIG. 11 is a view illustrating a modified example of the region AA of FIG. 9. In FIG. 11, for convenience of description, the first inorganic layer CVD1 and the second inorganic layer CVD2 are not illustrated.

Referring to a region AA-2 of FIG. 11, a partition wall DM-2 may include a base dam DM-B3, a first dam DM1, a second dam DM2, a third dam DM3, and a fourth dam DM4.

A groove HM may be defined in a portion of the base dam DM-B3, which does not overlap the first dam DM1 and the second dam DM2. The organic layer MN of the encapsulation layer TFE may be more effectively prevented from unnecessarily diffused by the groove HM defined in the base dam DM-B3.

Descriptions with respect to other components are substantially the same as those of the components of FIGS. 7 to 9 and thus will be omitted.

According to some example embodiments of the inventive concept, in the organic light emitting display device, the partition wall preventing the organic material of the encapsulation layer from flowing up to the unnecessary area may be provided.

Also, the partition wall may be reduced in width to provide the display device having the narrow bezel.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. An organic light emitting display panel comprising:
    a base member comprising a first area and a second area surrounding the first area;
    an organic light emitting element at the first area and comprising an anode, a cathode, and a light emitting layer between the anode and the cathode;
    a power electrode electrically connected to the anode and on the second area;
    a first base dam at the second area to cover one side of the power electrode;
    a connection electrode configured to cover one side of the power electrode and a first side of the first base dam, the connection electrode comprising the same material as the anode;
    a first dam covering the first side of the first base dam and one side of the connection electrode;
    a second dam covering a second side of the first base dam and spaced apart from the first dam;
    a third dam covering one side of the first dam and a portion of the connection electrode; and
    a fourth dam covering one side of the second dam and spaced apart from the third dam.

2. The organic light emitting display panel of claim 1, wherein the first dam comprises the same material as the second dam.

3. The organic light emitting display panel of claim 2, wherein the third dam comprises the same material as the fourth dam.

4. The organic light emitting display panel of claim 3, further comprising:
    a transistor electrically connected to the organic light emitting element; and
    an insulation layer covering the transistor, between the anode and the transistor, the insulation layer comprising the same material as the first base dam.

5. The organic light emitting display panel of claim 4, wherein a through-hole is defined in the insulation layer, and the anode is connected to the transistor through the through-hole.

6. The organic light emitting display panel of claim 5, further comprising a pixel defining layer in which an opening exposing the anode is defined and which comprises the same material as each of the first dam and the second dam.

7. The organic light emitting display panel of claim 6, further comprising a spacer on the pixel defining layer and comprising the same material as each of the third dam and the fourth dam.

8. The organic light emitting display panel of claim 7, further comprising an encapsulation layer configured to seal the organic light emitting element,
    wherein the encapsulation layer comprises:
    a first inorganic layer configured covering the cathode, the first base dam, the first dam, the second dam, the third dam, and the fourth dam;
    an organic layer on the first inorganic layer and overlapping the cathode; and
    a second inorganic layer configured covering the organic layer and the first inorganic layer.

9. The organic light emitting display panel of claim 7, further comprising:

a second base dam on the second area and spaced apart from the first base dam;
a fifth dam covering a first side of the second base dam;
a sixth dam covering a second side of the second base dam and spaced apart from the fifth dam;
a seventh dam covering one side of the fifth dam; and
an eighth dam covering one side of the sixth dam.

10. The organic light emitting display panel of claim 9, wherein the second base dam comprises the same material as the first base dam,
each of the fifth dam and the sixth dam comprises the same material as each of the first dam and the second dam, and
each of the seventh dam and the eighth dam comprises the same material as each of the third dam and the fourth dam.

11. The organic light emitting display panel of claim 7, wherein a groove is formed in a portion of the first base dam, which does not overlap the first dam and the second dam.

12. The organic light emitting display panel of claim 1, wherein the power electrode is configured to transmit a power voltage to the organic light emitting element.

13. An organic light emitting display panel comprising:
a base member comprising a first area and a second area surrounding the first area;
an organic light emitting element on the first area and comprising an anode, a cathode, and a light emitting layer between the anode and the cathode;
a power electrode electrically connected to the anode and on the second area; and
a first partition wall comprising a base dam, a first dam, a second dam spaced apart from the first dam, a third dam, and a fourth dam spaced apart from the third dam,
wherein each of the base dam, the first dam, the second dam, the third dam, and the fourth dam comprises a first side and a second side that is further away from the organic light emitting element than the first side,
wherein the base dam is on the second area to cover one side of the power electrode,
the first dam covers the first side of the base dam,
the second dam covers the second side of the base dam,
the third dam covers the first side of the first dam, and
the fourth dam covers the second side of the second dam.

14. The organic light emitting display panel of claim 13, wherein the first dam comprises the same material as the second dam, and the third dam comprises the same material as the fourth dam.

15. The organic light emitting display panel of claim 14, further comprising:
a transistor electrically connected to the organic light emitting element; and
an insulation layer covering the transistor and comprising the same material as a first base dam.

16. The organic light emitting display panel of claim 15, further comprising a pixel defining layer in which an opening exposing the anode is defined and which comprises the same material as each of the first dam and the second dam.

17. The organic light emitting display panel of claim 16, further comprising a spacer on the pixel defining layer and comprising the same material as each of the third dam and the fourth dam.

18. The organic light emitting display panel of claim 17, further comprising an encapsulation layer configured to seal the organic light emitting element,
wherein the encapsulation layer comprises:
a first inorganic layer configured to cover the cathode, the first base dam, the first dam, the second dam, the third dam, and the fourth dam;
an organic layer on the first inorganic layer to overlap the cathode; and
a second inorganic layer configured to cover the organic layer and the first inorganic layer.

19. The organic light emitting display panel of claim 17, further comprising a second partition wall,
wherein the second partition wall comprises:
a second base dam on the second area and spaced apart from the first base dam;
a fifth dam covering a first side of the second base dam;
a sixth dam covering a second side of the second base dam and spaced apart from the fifth dam;
a seventh dam covering one side of the fifth dam; and
an eighth dam covering one side of the sixth dam.

20. The organic light emitting display panel of claim 19, wherein the second base dam comprises the same material as the first base dam;
each of the fifth dam and the sixth dam comprises the same material as each of the first dam and the second dam; and
each of the seventh dam and the eighth dam comprises the same material as each of the third dam and the fourth dam.

* * * * *